United States Patent
Chen et al.

(10) Patent No.: US 11,462,684 B2
(45) Date of Patent: Oct. 4, 2022

(54) RETENTION IMPROVEMENT BY HIGH-K ENCAPSULATION OF RRAM DEVICES

(71) Applicant: Intel Corporation, Santa Clara, CA (US)

(72) Inventors: Albert Chen, Portland, OR (US); Nathan Strutt, Beaverton, OR (US); Oleg Golonzka, Beaverton, OR (US); Pedro Quintero, Beaverton, OR (US); Christopher J. Jezewski, Portland, OR (US); Elijah V. Karpov, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 777 days.

(21) Appl. No.: 16/226,198

(22) Filed: Dec. 19, 2018

(65) Prior Publication Data

US 2020/0203605 A1 Jun. 25, 2020

(51) Int. Cl.
*H01L 45/00* (2006.01)

(52) U.S. Cl.
CPC ...... *H01L 45/1253* (2013.01); *H01L 45/1616* (2013.01)

(58) Field of Classification Search
CPC ............... H01L 45/1233; H01L 45/146; H01L 45/1641
See application file for complete search history.

(56) References Cited

U.S. PATENT DOCUMENTS

| | | | |
|---|---|---|---|
| 8,456,891 B2* | 6/2013 | Baek | H01L 45/146 257/4 |
| 11,245,074 B2* | 2/2022 | Lv | H01L 45/1266 |
| 2006/0054950 A1 | 3/2006 | Baek | |
| 2011/0291066 A1 | 12/2011 | Baek | |
| 2014/0097396 A1 | 4/2014 | Murase | |
| 2014/0252298 A1 | 9/2014 | Li | |
| 2015/0171142 A1 | 6/2015 | Kawashima | |

OTHER PUBLICATIONS

Office Action from European Patent Application No. 19209848.1, dated Apr. 29, 2020, 7pgs.
Extended European Search Report for European Patent Application No. 21208003.0, dated Mar. 4, 2022, 8 pgs.

* cited by examiner

*Primary Examiner* — Mark V Prenty
(74) *Attorney, Agent, or Firm* — Schwabe, Williamson & Wyatt, P.C.

(57) ABSTRACT

An RRAM device is disclosed. The RRAM device includes a bottom electrode, a high-k material on the bottom electrode, a top electrode, a top contact on the top electrode and an encapsulating layer of $Al_2O_3$. The encapsulating layer encapsulates the bottom electrode, the high-k material, the top electrode and the top contact.

21 Claims, 10 Drawing Sheets

RETENTION IMPROVEMENT BY HIGH-K ENCAPSULATION OF RRAM DEVICES

TECHNICAL FIELD

Embodiments of the disclosure pertain to retention improvement of RRAM devices and, in particular, to retention improvement by high-k encapsulation of RRAM devices.

BACKGROUND

RRAM, also known as ReRAM (resistive random access memory), is a form of nonvolatile data storage that operates by changing the resistance of a specially formulated solid dielectric material. An RRAM device contains a component called a memristor whose resistance varies when different voltages are imposed across it.

Normally, a dielectric material does not conduct electric current. However, if the dielectric material is subjected to a high enough voltage, it will suddenly conduct because of dielectric breakdown. In a conventional dielectric material, dielectric breakdown causes permanent damage and failure of the associated component. In a memristor, the dielectric breakdown is temporary and reversible because of the materials that are used. In one form of memristor, a deliberately applied voltage causes the medium to acquire microscopic conductive paths called filaments. The filaments appear as a result of various phenomena such as metal migration or physical defects. Once a filament appears, it can be broken or reversed by the application of a different external voltage. The controlled formation and destruction of filaments in large numbers allows for storage of digital data. The voltage that is used initially to cause the medium to acquire the microscopic conductive paths is called the forming voltage.

An RRAM device is placed in a low resistance state by applying a forming voltage that causes the dielectric to assume a resistance level that is below a given resistance threshold. RRAM devices that are in a low resistance state (LRS) that are exposed to moisture can exhibit retention failure. The retention failure is characterized by the drifting of bits in a low resistance state to a higher resistance than a given reference resistance level (RL).

In a previous approach a transistor that is more powerful than is conventionally used is employed to generate high write currents in order to program devices into a LRS with a thicker filament. This approach oftentimes requires a larger transistor than is conventionally used. The larger transistors occupy more space and thus can result in reduced memory density. Moreover, the larger RRAM filaments that are formed can result in decreased endurance.

DESCRIPTION OF THE EMBODIMENTS

Figure 1A:
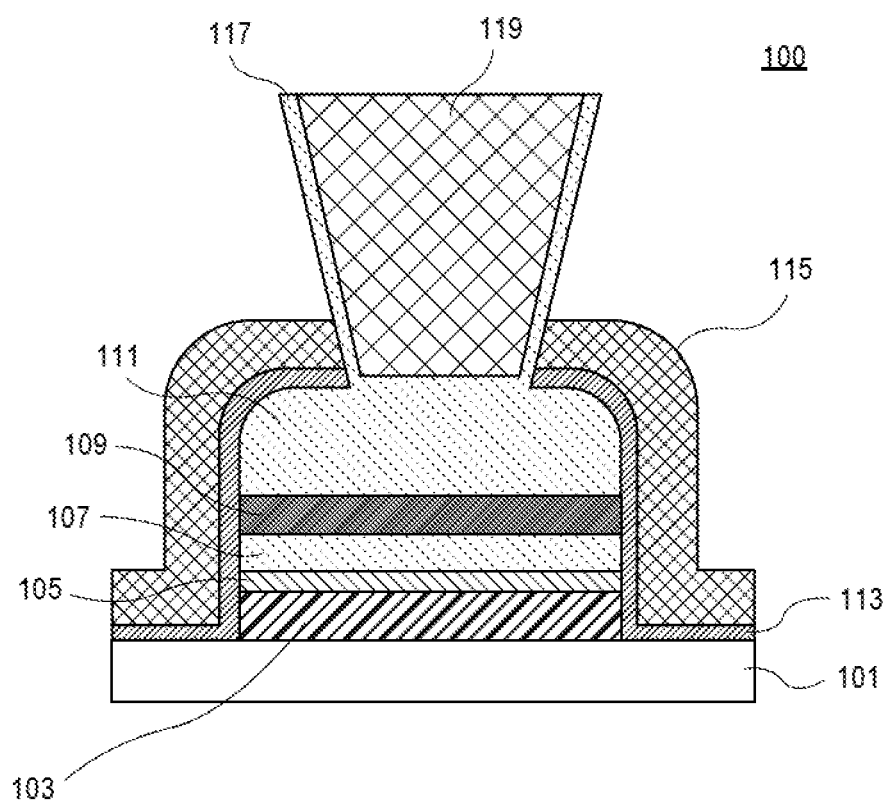
FIG. 1A is an illustration of a cross-section of an RRAM device according to an embodiment.

RRAM retention improvement by high-k encapsulation of RRAM devices is described. It should be appreciated that although embodiments are described herein with reference to example high-k encapsulation of RRAM device implementations, the disclosure is more generally applicable to retention improvement by high-k encapsulation of RRAM device implementations as well as other type retention improvement by high-k encapsulation of RRAM device implementations. In the following description, numerous specific details are set forth, such as specific integration and material regimes, in order to provide a thorough understanding of embodiments of the present disclosure. It will be apparent to one skilled in the art that embodiments of the present disclosure may be practiced without these specific details. In other instances, well-known features, such as integrated circuit design layouts, are not described in detail in order to not unnecessarily obscure embodiments of the present disclosure. Furthermore, it is to be appreciated that the various embodiments shown in the Figures are illustrative representations and are not necessarily drawn to scale.

Certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

RRAM devices in the low resistance state (LRS) that are exposed to moisture can experience retention failure. The retention failure is characterized by the drifting of bits in a low resistance state to a resistance that is higher than a given reference resistance level (RL). In a previous approach to addressing retention failure, a transistor that is more powerful than is conventionally used is employed to generate high write currents in order to program devices into a LRS with a thicker filament. This approach oftentimes requires a larger transistor than is conventionally used. The larger transistors occupy more space and thus can result in reduced memory density. Moreover, the larger RRAM filaments can result in poor endurance.

An approach that addresses the shortcomings of previous approaches is disclosed herein. For example, as part of a disclosed process the RRAM device is encapsulated with a thin aluminum oxide ($Al_2O_3$) layer that prevents moisture from penetrating the RRAM device. Preventing moisture from penetrating the RRAM device significantly improves LRS retention. In particular, the prevention of the penetration of moisture that is effected by the $Al_2O_3$ layer greatly reduces LRS drift to high resistance. This decreases the LRS failure rate by an order of magnitude. Moreover, the retention benefit does not come at the expense of yield or endurance.

In addition, in an embodiment, nitrogen is incorporated into high-k tantalum oxide ($Ta_2O_5$) by exposing a blanket physical vapor deposition (PVD) $Ta_2O_5$ film to a $N_2$ plasma. Nitrogen can also be doped into the high-k material using ion implantation. The incorporation of nitrogen into the high-k active layer significantly reduces retention failure from the drifting of devices from a low resistance state to a high resistance state. This retention benefit does not increase the set current that is needed for writing the device to LRS.

FIG. 1A is an illustration of a cross-section of an RRAM device 100 according to an embodiment. FIG. 1A shows bottom electrode 101, bottom electrode 103, high-k material 105, oxygen exchange layer (OEL) 107, top electrode 109, top contact 111, $Al_2O_3$ layer 113, SiN 115, barrier layer 117 and bit line contact 119.

Referring to FIG. 1A, the bottom electrode 103 is formed on the bottom electrode 101. The high-k material 105 is formed on bottom electrode 103. The OEL 107 is formed on the high-k material 105. The top electrode 109 is formed on the OEL 107. The top contact 111 is formed on the top electrode 109. The $Al_2O_3$ layer 113 encapsulates the bottom electrode 103, the high-k material 105, the OEL 107, the top electrode 109, and the top contact 111. The SiN 115 is formed on the $Al_2O_3$ layer 113. The bit line contact 119 is formed in the space formed by the bit line contact 119.

In an embodiment, the bottom electrode 101 can be formed from a noble metal or alloy (TiN, WN, Pt, Ru, Ir or TaN). In other embodiments, the bottom electrode 101 can be formed from other materials. In an embodiment, the bottom electrode 103 can be formed from noble metal or alloy. In other embodiments, the bottom electrode 103 can be formed from other materials. In an embodiment, the high-k material 105 can be formed from HfO, TaO, ZrO or SiO. In other embodiments, the high-k material 105 can be formed from other materials. In an embodiment, the OEL layer 107 can be formed from a reactive metal (e.g., can use metal corresponding to high-k material Hf, Ta, Zr, Ti etc.). In other embodiments, the OEL layer 107 can be formed from other materials. In an embodiment, the top electrode 109 can be formed from TiN, WN, Pt, Ru, Ir or TaN. In other embodiments, the top electrode 109 can be formed from other materials. In an embodiment, the top contact 111 can be formed from Ta or W. In other embodiments, the top contact 111 can be formed from other materials. In an embodiment, the barrier layer 117 can be formed from Ta. In other embodiments, the barrier layer 117 can be formed from other material. In an embodiment, bit line contact 119 can be formed from copper. In other embodiments, bit line contact 119 be formed from other materials.

In operation, when a set voltage is applied to the memory cell, a low resistance filament is created and the device is placed into a low resistance state. It should be appreciated that the set voltage causes the diffusion of oxygen from the high-k layer 105 into the OEL layer 107 to create the low resistance filament in the high-k material. The filament is characterized by oxygen vacancies. In an embodiment, a penetration of moisture into the high-k material can degrade the filament by causing the diffusion of oxygen vacancy eliminating oxygen atoms into the high-k dielectric. The degradation of the low resistance filament in this manner can cause the resistance of the high-k material to drift higher. Thus, the prevention of moisture from penetrating into the high-k dielectric can prevent a LRS drift of the resistance and significantly improve LRS retention. In an embodiment, moisture is prevented from diffusing into the low-k dielectric by the $Al_2O_3$ layer. In an embodiment, this can decrease the LRS failure rate by an order of magnitude. Moreover, the retention benefit does not come at the expense of yield or endurance.

It should be appreciated that the setting and resetting of the RRAM device 100 requires a certain level of oxygen atoms that can be removed from, and returned to, the high-k material in order to sufficiently change its resistance level from one resistance state to the other. The loss of oxygen atoms from the RRAM device 100 can cause a loss of the ability to reset the device by controlling the diffusion of oxygen into and out of the high-k material 105. Thus, without a mechanism to retain oxygen in the RRAM device 100, the ability to reset the device can be lost after a number of cycles. The number of cycles that it takes to reach this point is referred to as endurance. In an embodiment, the $Al_2O_3$ layer 113 prevents oxygen atoms from escaping the RRAM device 100. Thus, in an embodiment, endurance is increased as the $Al_2O_3$ layer 113 slows the escape of oxygen from the device. In other embodiments, other materials can be used to prevent the loss of oxygen from the RRAM device 100.

In an embodiment, the RRAM device 100 can be formed on blanket RRAM films using lithography. In an embodiment, dry etching can be used to transfer a photomask pattern to underlying RRAM films. In other embodiments, other manner of transferring the photomask pattern can be used. The structure can then be encapsulated with an atomic layer deposition (ALD) aluminum oxide ($Al_2O_3$) and CVD SiN film. The $Al_2O_3$ film acts as a hermetic barrier to the diffusion of moisture into the high-k active layer of the RRAM device 100. As described herein, the reduced moisture content reduces oxygen diffusion into the device and improves retention of the low resistance state (LRS). Thus, in an embodiment, the $Al_2O_3$ encapsulation significantly reduces retention failures by decreasing the drift of the low resistance state (LRS) to resistances above the reference level (RL).

Figure 1B:
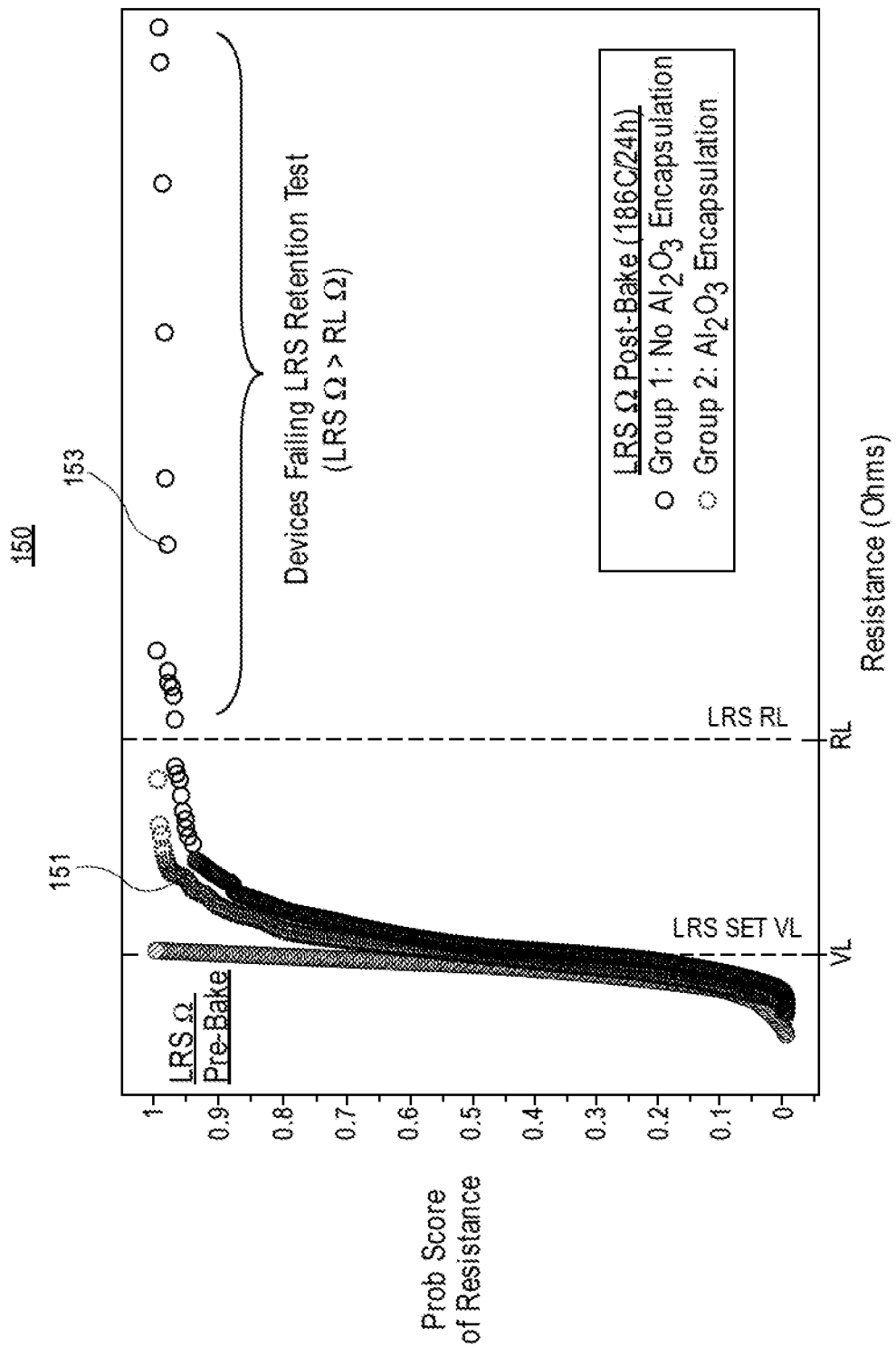
FIG. 1B is an illustration of a graph of plots from a low resistance state (LRS) retention test of devices with high-k encapsulation and without high-k encapsulation.

FIG. 1B shows a graph 150 of plots from a LRS retention test of devices with $Al_2O_3$ encapsulation 151 and without high-k encapsulation 153. Both of the device types represented in the retention plots of FIG. 1B, have a SiN encapsulation layer (e.g., 115 in FIG. 1A). In an embodiment, both device types are programmed to a low resistance state by increasing a SET voltage until the LRS read resistance (LRS resistance before being heated) is below a resistance verify level (VL). The devices are then heated at 185 degrees Celsius for 24 hours whereupon the resistance is measured at the read voltage. The post bake resistance is compared to a reference resistance level (RL). Devices programmed to the LRS which drift to a resistance level above the RL are considered retention failures. Referring to FIG. 1B, the post-bake resistance distribution for the group of devices with $Al_2O_3$ encapsulation is tighter than the group with no high-k encapsulation. It should be appreciated that the results shown in FIG. 1B are exemplary and in other embodiments other results can be provided.

Figure 2A:
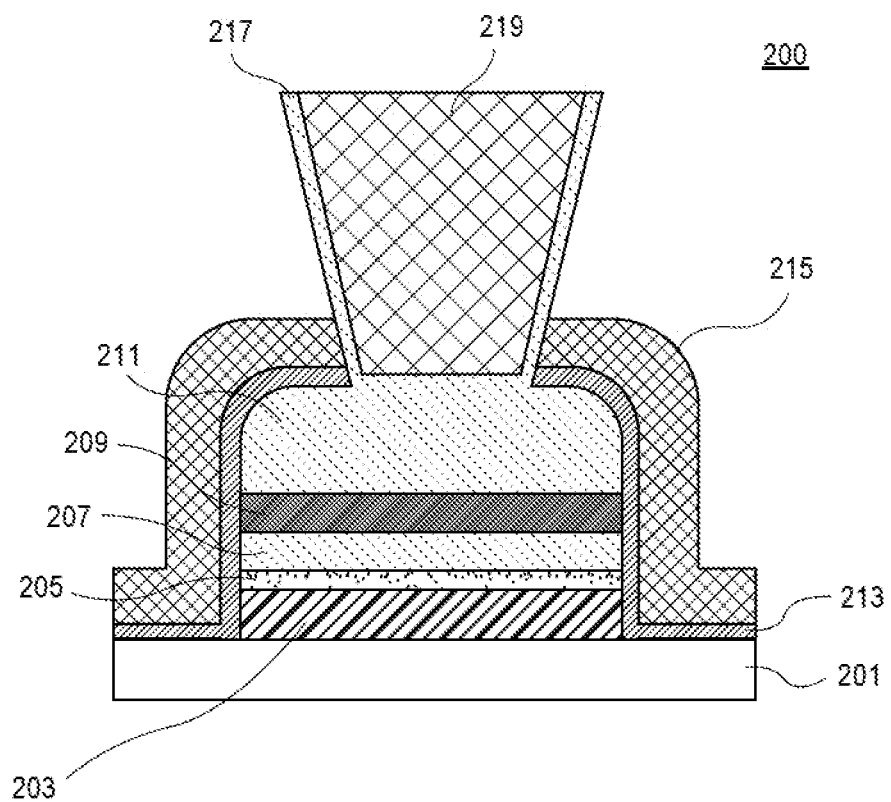
FIG. 2A is an illustration of a cross-section of a RRAM device according to an embodiment.

FIG. 2A is an illustration of a cross-section of a RRAM device 200 according to an embodiment. FIG. 2A shows bottom electrode 201, bottom electrode 203, high k material 205, oxygen exchange layer (OEL) 207, top electrode 209, top contact 211, $Al_2O_3$ layer 213, SiN 215, barrier layer 217 and bit line contact 219. These structures are similar to those of the RRAM device 100 shown in FIG. 1A and thus are not described again here for purposes of clarity and brevity. In an embodiment, in addition to the structures of RRAM device 100 shown in FIG. 1A, RRAM device 200 includes a high-k active layer 205 that is doped with nitrogen.

Referring to FIG. 2A, the stoichiometric $Ta_2O_5$ high-k film 205, which serves as the active layer for the RRAM device 200, is doped with nitrogen either by exposure to an $N_2$ plasma or an N implant process. In an embodiment, the RRAM device 200 can be doped with nitrogen after the deposition of the $Ta_2O_5$ high-k film 205. In an embodiment, the nitrogen is substitutionally incorporated into the $Ta_2O_5$ lattice displacing oxygen in the film. The $N_2$ plasma treatment significantly reduces retention failures by decreasing the drift of a low resistance state (LRS) resistance to resistances above the reference level (RL).

In operation, the incorporation of nitrogen into the high-k active layer 205 the RRAM device 200 significantly improves LRS retention. In particular, the incorporation of nitrogen into the high-k active layer significantly reduces retention failure from the drifting of devices from a low resistance state to a high resistance state. This retention benefit does not increase the set current that is needed for writing the device to LRS.

Figure 2B:
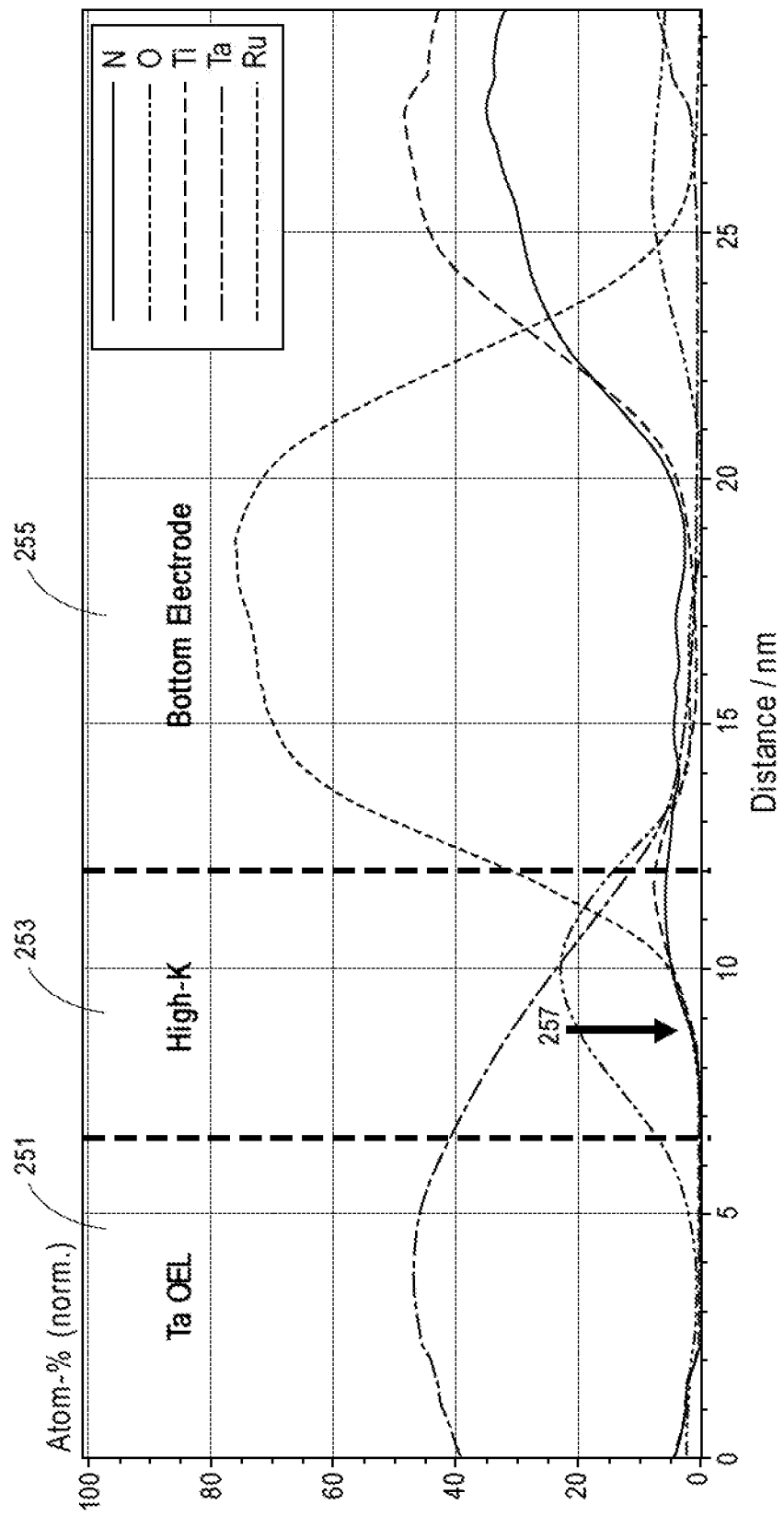
FIGS. 2B-2E are illustrations of energy-dispersive x-ray spectroscopy (EDX) line scans of a device with no nitrogen incorporation, a device with nitrogen doping and a device with a plasma enhanced nitrogen implant.
Figure 2C:
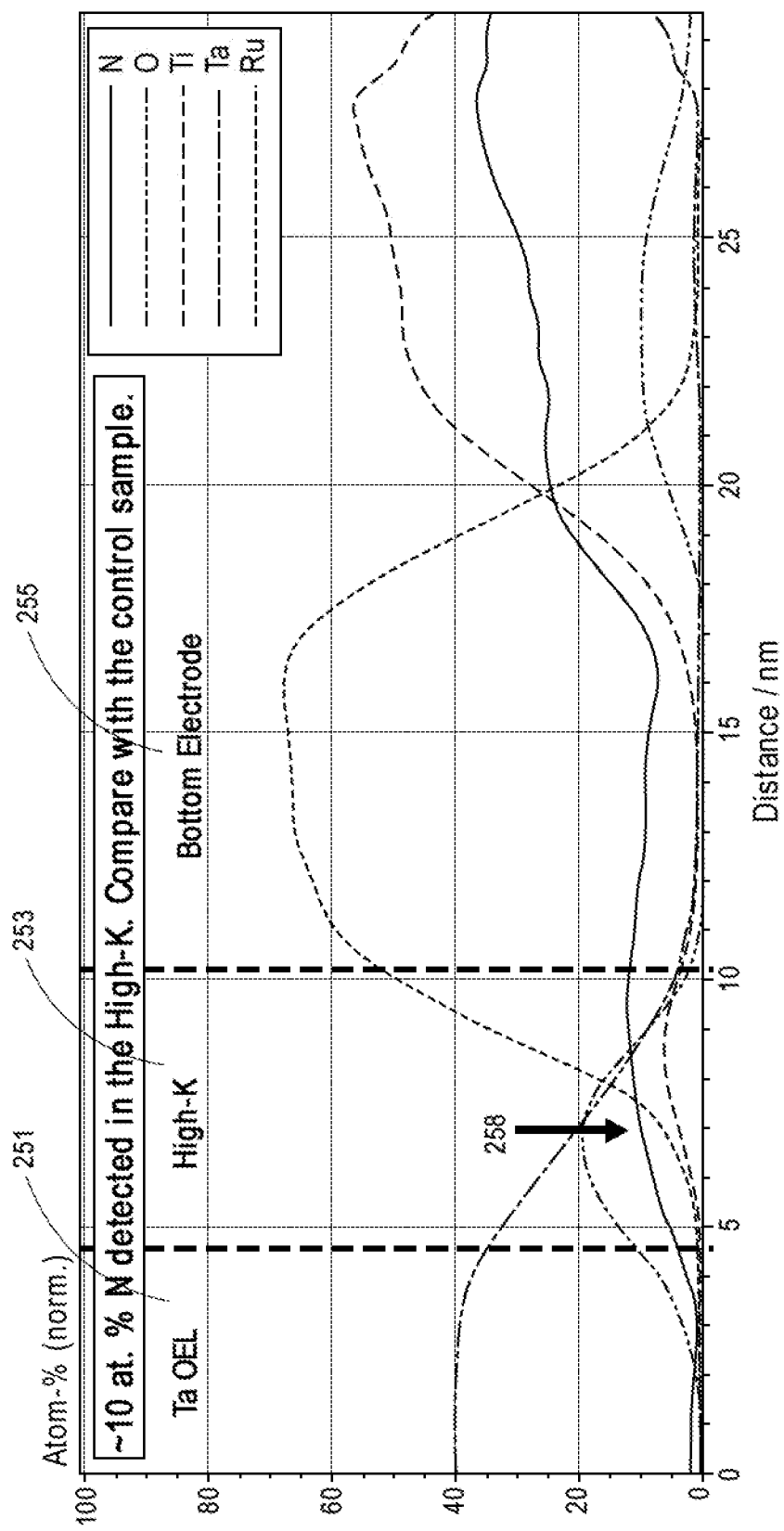
Figure 2D:
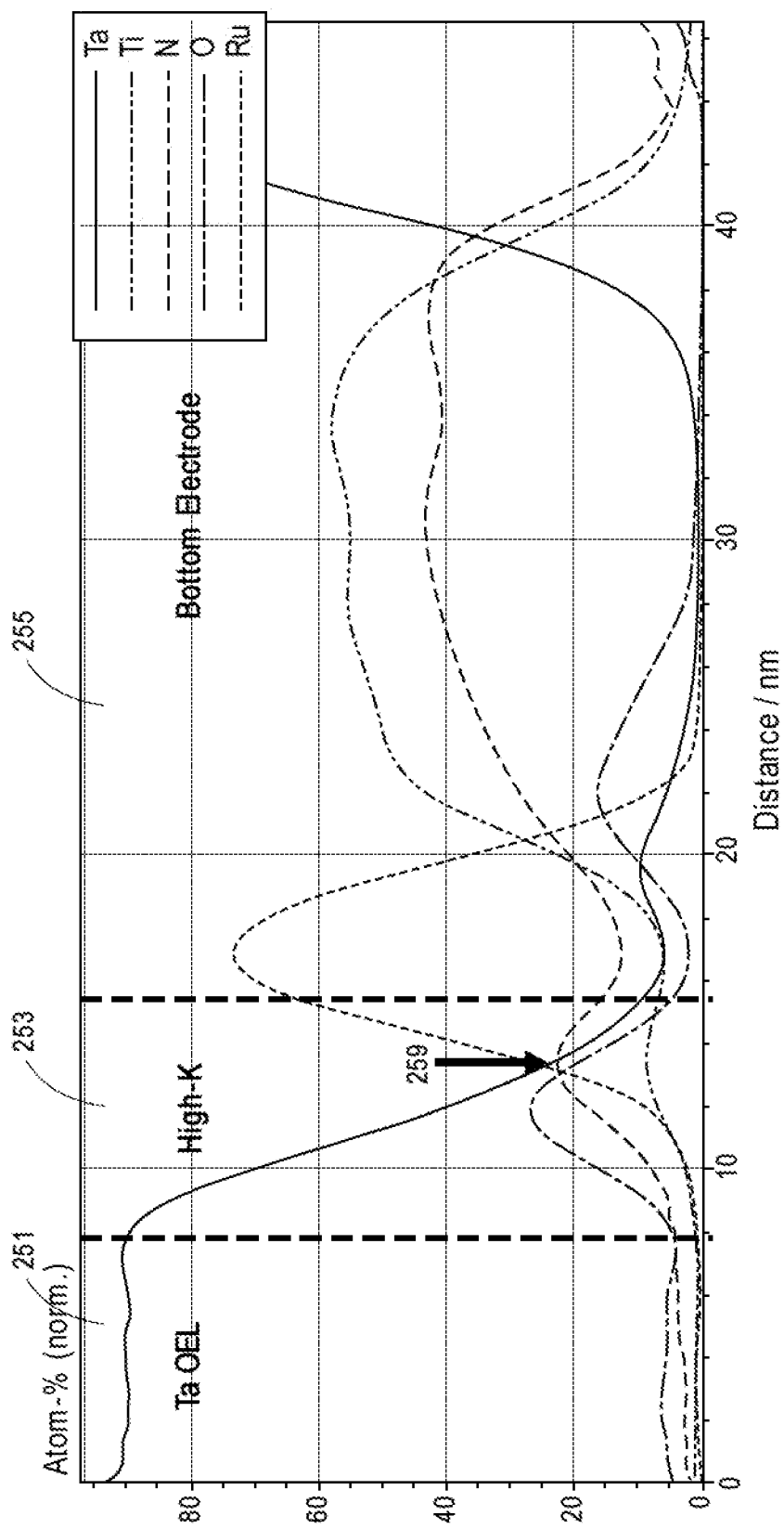

FIG. 2B, FIGS. 2C and 2D show energy-dispersive x-ray spectroscopy (EDX) line scans of a device with no nitrogen incorporation, a device with nitrogen doping and a device with plasma enhanced nitrogen implant. FIGS. 2B, 2C and 2D include plots with sections that correspond to the OEL 251, the high-k material 253 and the bottom electrode 255. Referring to FIGS. 2B and 2C, a comparison of the section of the plots that correspond to the high-k material 253 show an increased nitrogen concentration in the $Ta_2O_5$ high-k film with nitrogen doping (see FIG. 2C arrow 258) as compared to the high-k film without doping (see FIG. 2B arrow 257). Referring to FIGS. 2C and 2D, the section of the plots that correspond to the high-k material 253 shows an increased nitrogen concentration in the $Ta_2O_5$ high-k film with enhanced nitrogen implant (FIG. 2D) as compared to the high-k film with doping in (FIG. 2C). In FIG. 2D the arrow 259 points to a part of the plot that illustrates increased nitrogen concentration in the high-k material of the RRAM device.

Figure 2E:
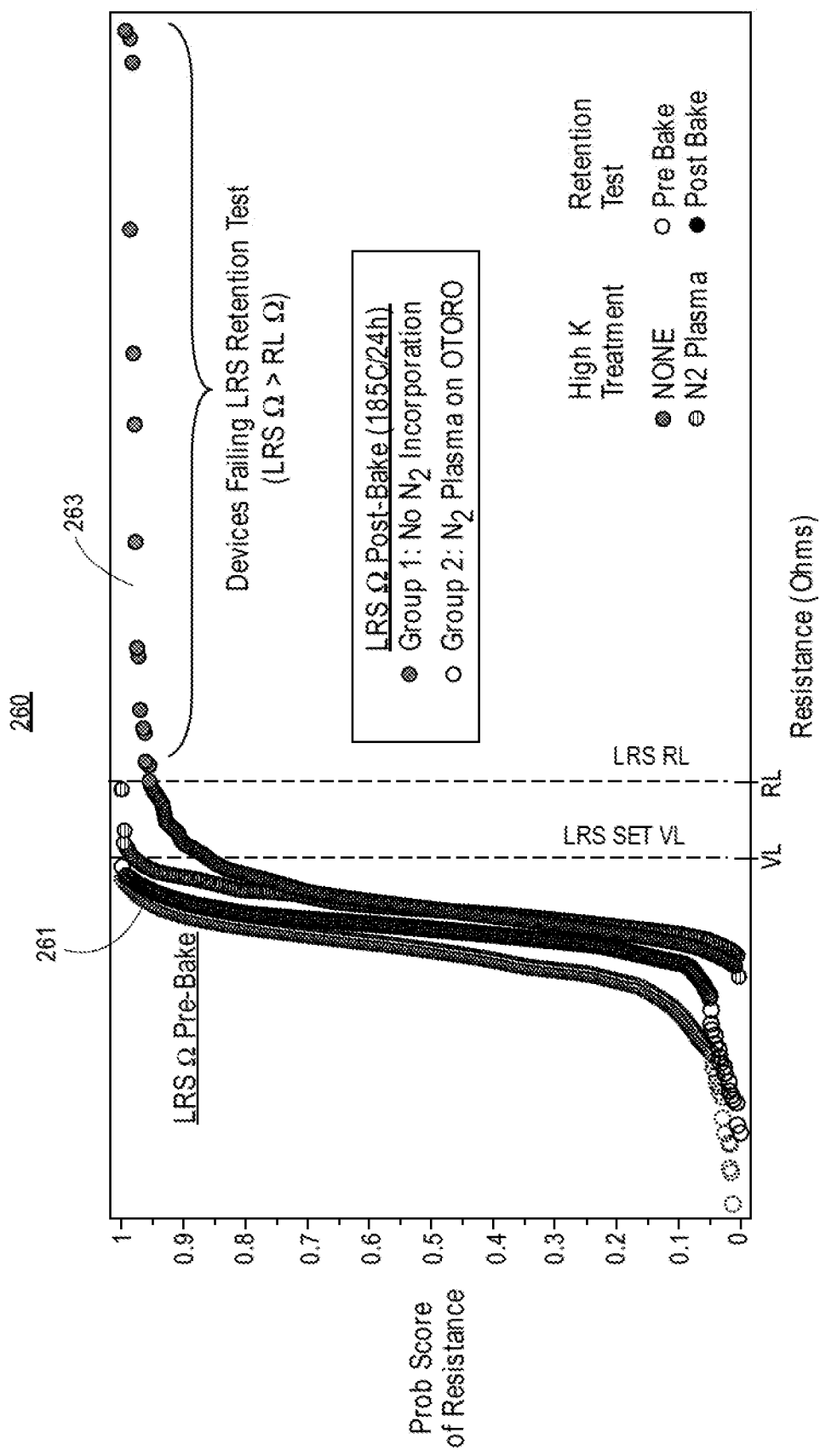

FIG. 2E shows a graph 260 of plots of example results from a low resistance state (LRS) retention test between RRAM devices without nitrogen incorporation into high-K and with $N_2$ plasma treatment. In an embodiment, the RRAM devices are programmed to a low resistance state by increasing the SET voltage until the LRS read resistance (LRS resistance before being heated) is below a given verify level (VL). The RRAM devices are then heated at 185 degrees Celsius for 24 hours and the resistance is measured at the read voltage. In an embodiment, the resistance after being heated is compared to a reference resistance level (RL). In an embodiment, the RRAM devices that are programmed to LRS that experience a drift to a resistance level above the RL are considered to be retention failures. Referring to FIG. 2E, the post-bake resistance distribution for the group of devices with $N_2$ plasma treatment 261 is tighter than the group 263 with no treatment and has no devices with resistance greater than the RL. It should be noted that results shown in FIG. 2E are exemplary and in other embodiments other results can be provided.

Figure 3:
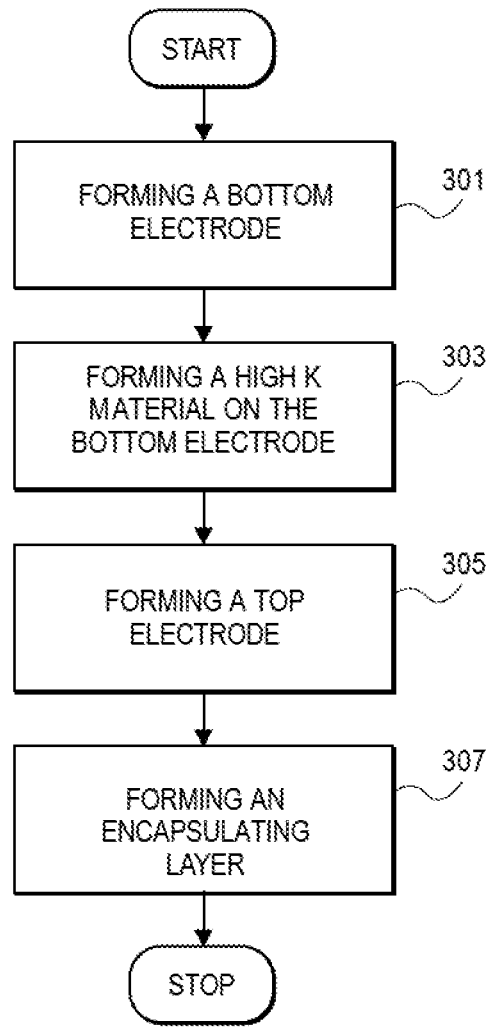
FIG. 3 is a flowchart of a method for forming an RRAM device with improved LRS retention according to an embodiment.

FIG. 3 is flowchart 300 of a method for forming an RRAM device with improved LRS retention according to an embodiment. Referring to FIG. 3, the method includes at 301, forming a bottom electrode. At 303, forming a high-k material on the bottom electrode. At 305, forming a top electrode and forming a top contact on the top electrode. At 307, forming an encapsulating layer of $Al_2O_3$ that encapsulates the bottom electrode, the high-k material, the top electrode and the top contact. In an embodiment, the high-k material is configured to store data. In an embodiment, the encapsulating layer of $Al_2O_3$ is formed to block moisture. In an embodiment, a SiN film is formed on the encapsulating layer. In an embodiment, an oxygen exchange layer (OEL) material is formed on the high-k material. In an embodiment, a layer that includes a noble metal or alloy is formed under the encapsulating layer and the bottom electrode.

Implementations of embodiments of the invention may be formed or carried out on a substrate, such as a semiconductor substrate. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which a semiconductor device may be built falls within the spirit and scope of the present invention.

A plurality of transistors, such as metal-oxide-semiconductor field-effect transistors (MOSFET or simply MOS transistors), may be fabricated on the substrate. In various implementations of the invention, the MOS transistors may be planar transistors, nonplanar transistors, or a combination of both. Nonplanar transistors include FinFET transistors such as double-gate transistors and tri-gate transistors, and wrap-around or all-around gate transistors such as nanoribbon and nanowire transistors. Although the implementations described herein may illustrate only planar transistors, it should be noted that the invention may also be carried out using nonplanar transistors.

Each MOS transistor includes a gate stack formed of at least two layers, a gate dielectric layer and a gate electrode layer. The gate dielectric layer may include one layer or a stack of layers. The one or more layers may include silicon oxide, silicon dioxide (SiO2) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

The gate electrode layer is formed on the gate dielectric layer and may consist of at least one P-type workfunction metal or N-type workfunction metal, depending on whether the transistor is to be a PMOS or an NMOS transistor. In some implementations, the gate electrode layer may consist of a stack of two or more metal layers, where one or more metal layers are workfunction metal layers and at least one metal layer is a fill metal layer.

For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a workfunction that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a workfunction that is between about 3.9 eV and about 4.2 eV.

In some implementations, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the invention, the gate electrode may consist of a combination of U-shaped structures and planar, non-U-shaped structures. For example, the gate electrode may consist of one or more U-shaped metal layers formed atop one or more planar, non-U-shaped layers.

In some implementations of the invention, a pair of sidewall spacers may be formed on opposing sides of the gate stack that bracket the gate stack. The sidewall spacers may be formed from a material such as silicon nitride, silicon oxide, silicon carbide, silicon nitride doped with carbon, and silicon oxynitride. Processes for forming sidewall spacers are well known in the art and generally include deposition and etching process steps. In an alternate implementation, a plurality of spacer pairs may be used, for instance, two pairs, three pairs, or four pairs of sidewall spacers may be formed on opposing sides of the gate stack.

As is well known in the art, source and drain regions are formed within the substrate adjacent to the gate stack of each MOS transistor. The source and drain regions are generally formed using either an implantation/diffusion process or an etching/deposition process. In the former process, dopants such as boron, aluminum, antimony, phosphorous, or arsenic may be ion-implanted into the substrate to form the source and drain regions. An annealing process that activates the dopants and causes them to diffuse further into the substrate typically follows the ion implantation process. In the latter process, the substrate may first be etched to form recesses at the locations of the source and drain regions. An epitaxial deposition process may then be carried out to fill the recesses with material that is used to fabricate the source and drain regions. In some implementations, the source and drain regions may be fabricated using a silicon alloy such as silicon germanium or silicon carbide. In some implementations the epitaxially deposited silicon alloy may be doped in situ with dopants such as boron, arsenic, or phosphorous. In further embodiments, the source and drain regions may be formed using one or more alternate semiconductor materials such as germanium or a group III-V material or alloy. And in further embodiments, one or more layers of metal and/or metal alloys may be used to form the source and drain regions.

One or more interlayer dielectrics (ILD) are deposited over the MOS transistors. The ILD layers may be formed using dielectric materials known for their applicability in integrated circuit structures, such as low-k dielectric materials. Examples of dielectric materials that may be used include, but are not limited to, silicon dioxide (SiO2), carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass. The ILD layers may include pores or air gaps to further reduce their dielectric constant.

Figure 4:
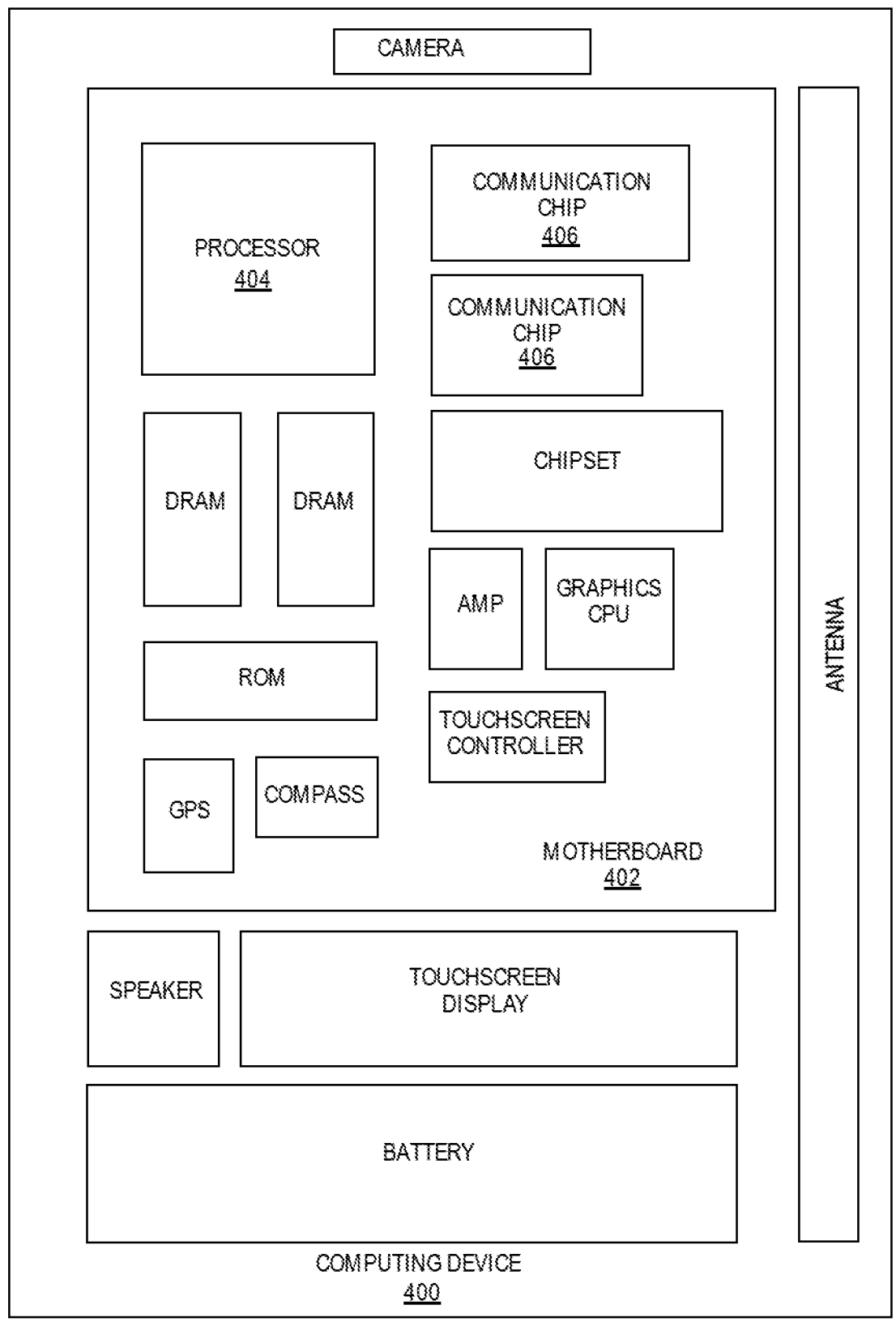
FIG. 4 illustrates a computing device in accordance with one implementation of an embodiment.

FIG. 4 illustrates a computing device 400 in accordance with one implementation of the invention. The computing device 400 houses a board 402. The board 402 may include a number of components, including but not limited to a processor 404 and at least one communication chip 406. The processor 404 is physically and electrically coupled to the board 402. In some implementations the at least one communication chip 406 is also physically and electrically coupled to the board 402. In further implementations, the communication chip 406 is part of the processor 404.

Depending on its applications, computing device 400 may include other components that may or may not be physically and electrically coupled to the board 402. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 406 enables wireless communications for the transfer of data to and from the computing device 400. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 406 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 400 may include a plurality of communication chips 406. For instance, a first communication chip 406 may be dedicated to shorter range wireless communications such as Wi-Fi and Bluetooth and a second communication chip 406 may be dedicated to longer range wireless communications such as GPS, EDGE, GPRS, CDMA, WiMAX, LTE, Ev-DO, and others.

The processor 404 of the computing device 400 includes an integrated circuit die packaged within the processor 404. In some implementations of the invention, the integrated circuit die of the processor includes one or more devices, such as MOS-FET transistors built in accordance with implementations of the invention. The term "processor" may refer to any device or portion of a device that processes electronic data from registers and/or memory to transform that electronic data into other electronic data that may be stored in registers and/or memory.

The communication chip 406 also includes an integrated circuit die packaged within the communication chip 406. In accordance with another implementation of the invention, the integrated circuit die of the communication chip includes one or more devices, such as MOS-FET transistors built in accordance with implementations of the invention.

In further implementations, another component housed within the computing device 400 may contain an integrated circuit die that includes one or more devices, such as MOS-FET transistors built in accordance with implementations of the invention.

In various implementations, the computing device 400 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 400 may be any other electronic device that processes data.

Figure 5:
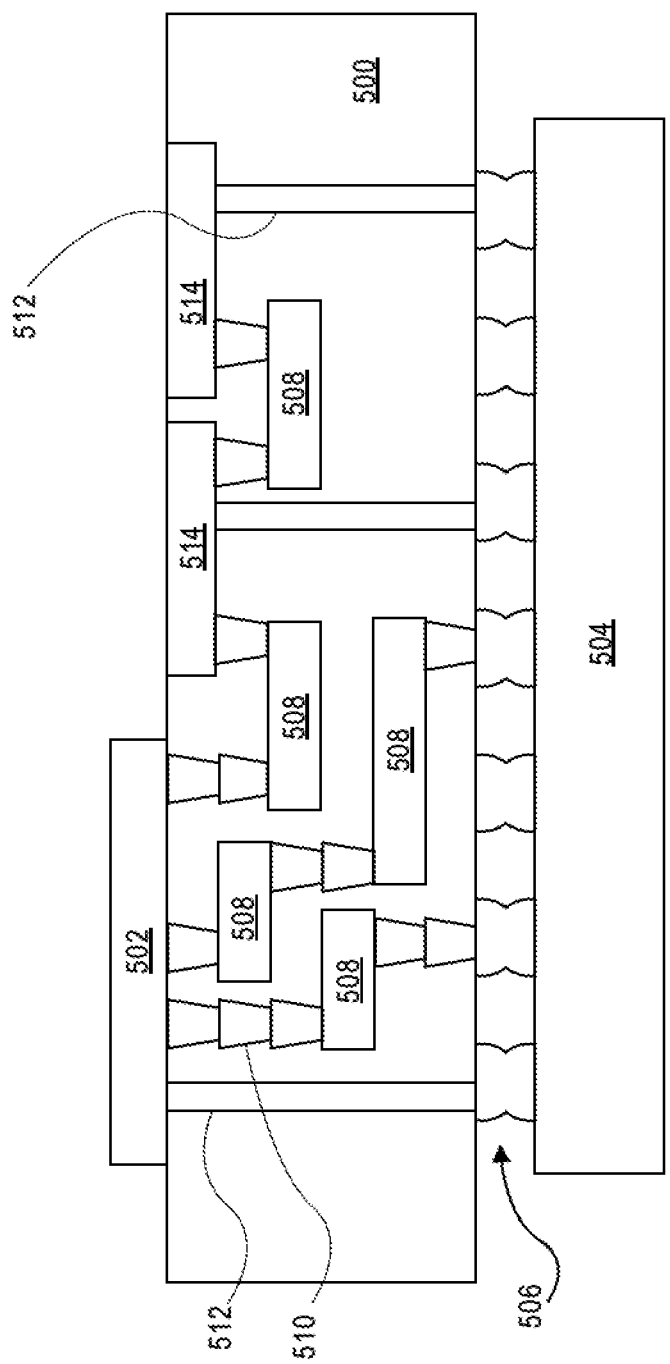
FIG. 5 illustrates an interposer that includes one or more examples of an embodiment.

FIG. 5 illustrates an interposer 500 that includes one or more embodiments of the invention. The interposer 500 is an intervening substrate used to bridge a first substrate 502 to a second substrate 504. The first substrate 502 may be, for instance, an integrated circuit die. The second substrate 504 may be, for instance, a memory module, a computer motherboard, or another integrated circuit die. Generally, the purpose of an interposer 500 is to spread a connection to a wider pitch or to reroute a connection to a different connection. For example, an interposer 500 may couple an integrated circuit die to a ball grid array (BGA) 506 that can subsequently be coupled to the second substrate 504. In some embodiments, the first and second substrates 502/504 are attached to opposing sides of the interposer 500. In other embodiments, the first and second substrates 502/504 are attached to the same side of the interposer 500. And in further embodiments, three or more substrates are interconnected by way of the interposer 500.

The interposer 500 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 508 and vias 510, including but not limited to through-silicon vias (TSVs) 512. The interposer 500 may further include embedded devices 514, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 500. In accordance with embodiments of the invention, apparatuses or processes disclosed herein may be used in the fabrication of interposer 500.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of the present disclosure.

The scope of the present disclosure includes any feature or combination of features disclosed herein (either explicitly or implicitly), or any generalization thereof, whether or not it mitigates any or all of the problems addressed herein.

Accordingly, new claims may be formulated during prosecution of the present application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

The following examples pertain to further embodiments. The various features of the different embodiments may be variously combined with some features included and others excluded to suit a variety of different applications.

Example Embodiment 1

An RRAM device, including a bottom electrode, a high-k material on the bottom electrode, a top electrode; a top contact on the top electrode, and an encapsulating layer of $Al_2O_3$ that encapsulates the bottom electrode, the high-k material, the top electrode and the top contact.

Example Embodiment 2

The RRAM device of example embodiment 1, wherein the high-k material is configured to store data.

Example Embodiment 3

The RRAM device of example embodiment 1, wherein the encapsulating layer of $Al_2O_3$ is configured to block moisture.

Example Embodiment 4

The RRAM device of example embodiment 1, further comprising SiN film formed on the encapsulating layer.

Example Embodiment 5

The RRAM device of example embodiment 1, further comprising an oxygen exchange layer (OEL) material on the high-k material.

Example Embodiment 6

The RRAM device of example embodiment 1, further comprising a layer that includes a noble metal or alloy under the encapsulating layer and the bottom electrode.

Example Embodiment 7

The RRAM device of example embodiment 1, 2, 3, 4, 5 or 6 further comprising a bit line contact coupled to the top electrode.

Example Embodiment 8

An RRAM device, including a bottom electrode, a high-k material including $Ta_2O_5$ doped with nitrogen on the bottom electrode, a top electrode, a top contact on the top electrode, and an encapsulating layer of $Al_2O_3$ that encapsulates the bottom electrode, the high-k material, the top electrode and the top contact.

Example Embodiment 9

The RRAM device of example embodiment 8, wherein the high-k material is configured to store data.

Example Embodiment 10

The RRAM device of example embodiment 8, wherein the encapsulating layer of $Al_2O_3$ is configured to block moisture.

Example Embodiment 11

The RRAM device of example embodiment 8, further comprising SiN film formed on the encapsulating layer.

Example Embodiment 12

The RRAM device of example embodiment 8, further comprising an oxygen exchange layer (OEL) material on the high-k material.

Example Embodiment 13

The RRAM device of example embodiment 8, further comprising a layer that includes a noble metal or alloy under the encapsulating layer and the bottom electrode.

Example Embodiment 14

The RRAM device of example embodiment 8, 9, 10, 11, 12 or 13 further comprising a bit line contact coupled to the top electrode.

Example Embodiment 15

A method, including forming a bottom electrode, forming a high-k material on the bottom electrode; forming a top electrode, forming a top contact on the top electrode, and forming an encapsulating layer of $Al_2O_3$ that encapsulates the bottom electrode, the high-k material, the top electrode and the top contact.

Example Embodiment 16

The method of example embodiment 15, wherein the high-k material is configured to store data.

Example Embodiment 17

The method of example embodiment 15, wherein forming the encapsulating layer of $Al_2O_3$ includes forming the encapsulating layer of $Al_2O_3$ to block moisture.

Example Embodiment 18

The method of example embodiment 15, further comprising forming SiN film on the encapsulating layer.

Example Embodiment 19

The method of example embodiment 15, further comprising forming an oxygen exchange layer (OEL) material on the high-k material.

Example Embodiment 20

The method of example embodiment 15, 16, 17, 18 or 19 further comprising forming a layer that includes a noble metal or alloy under the encapsulating layer and the bottom electrode.

What is claimed is:

1. An RRAM device, comprising:
   a bottom electrode;
   a high-k material on the bottom electrode;
   a top electrode;
   a top contact on the top electrode;
   a first encapsulating layer that encapsulates the bottom electrode, the high-k material, the top electrode and the top contact, the first encapsulating layer comprising aluminum and oxygen; and
   a second encapsulating layer on the first encapsulating layer, the second encapsulating layer comprising silicon and nitrogen.

2. The RRAM device of claim 1, wherein the high-k material is configured to store data.

3. The RRAM device of claim 1, wherein the first encapsulating layer is configured to block moisture.

4. The RRAM device of claim 1, wherein the second encapsulating layer comprises an SiN film.

5. The RRAM device of claim 1, further comprising an oxygen exchange layer (OEL) material on the high-k material.

6. The RRAM device of claim 1, further comprising a layer including a noble metal or alloy under the first encapsulating layer and the bottom electrode.

7. The RRAM device of claim 1, further comprising a bit line contact coupled to the top electrode.

8. An RRAM device, comprising:
   a bottom electrode;
   a high-k material including $Ta_2O_5$ doped with nitrogen on the bottom electrode;
   a top electrode;
   a top contact on the top electrode; and
   a first encapsulating layer that encapsulates the bottom electrode, the high-k material, the top electrode and the top contact, the first encapsulating layer comprising aluminum and oxygen; and
   a second encapsulating layer on the first encapsulating layer, the second encapsulating layer comprising silicon and nitrogen.

9. The RRAM device of claim 8, wherein the high-k material is configured to store data.

10. The RRAM device of claim 8, wherein the first encapsulating layer is configured to block moisture.

11. The RRAM device of claim 8, wherein the second encapsulating layer comprises an SiN film.

12. The RRAM device of claim 8, further comprising an oxygen exchange layer (OEL) material on the high-k material.

13. The RRAM device of claim 8, further comprising a layer that includes a noble metal or alloy under the first encapsulating layer and the bottom electrode.

14. The RRAM device of claim 8, further comprising a bit line contact coupled to the top electrode.

15. A method, comprising:
   forming a bottom electrode;
   forming a high-k material on the bottom electrode;
   forming a top electrode;
   forming a top contact on the top electrode; and
   forming a first encapsulating layer that encapsulates the bottom electrode, the high-k material, the top electrode and the top contact, the first encapsulating layer comprising aluminum and oxygen; and forming a second encapsulating layer on the first encapsulating layer, the second encapsulating layer comprising silicon and nitrogen.

16. The method of claim 15, wherein the high-k material is configured to store data.

17. The method of claim 15, wherein forming the first encapsulating layer includes forming an encapsulating layer of $Al_2O_3$ to block moisture.

18. The method of claim 15, wherein forming the second encapsulating layer comprises forming an SiN film on the first encapsulating layer.

19. The method of claim 15, further comprising forming an oxygen exchange layer (OEL) material on the high-k material.

20. The method of claim 15, further comprising forming a layer that includes a noble metal or alloy under the first encapsulating layer and the bottom electrode.

21. An RRAM device, comprising:
a bottom electrode;
a high-k material on the bottom electrode;
a top electrode;
a top contact on the top electrode;
an encapsulating layer of $Al_2O_3$ that encapsulates the bottom electrode, the high-k material, the top electrode and the top contact; and
a layer including a noble metal or alloy under the encapsulating layer and the bottom electrode.

* * * * *